(12) United States Patent
Kanie et al.

(10) Patent No.: US 8,045,352 B2
(45) Date of Patent: Oct. 25, 2011

(54) POWER CONVERTER

(75) Inventors: Naohito Kanie, Aichi-ken (JP); Toshiaki Nagase, Aichi-ken (JP); Hiroyuki Kobayashi, Aichi-ken (JP); Toshinari Fukatsu, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 388 days.

(21) Appl. No.: 12/465,014

(22) Filed: May 13, 2009

(65) Prior Publication Data

US 2009/0290398 A1 Nov. 26, 2009

(30) Foreign Application Priority Data

May 20, 2008 (JP) ................................. 2008-132264

(51) Int. Cl.
*H02M 7/537* (2006.01)

(52) U.S. Cl. ...................................................... 363/144

(58) Field of Classification Search ................... 363/95, 363/97, 98, 131, 132, 144, 146, 147
See application file for complete search history.

(56) References Cited

U.S. PATENT DOCUMENTS

| 6,212,087 | B1 * | 4/2001 | Grant et al. ................... 363/144 |
| 6,972,972 | B2 * | 12/2005 | Duncan et al. .............. 363/56.01 |
| 7,289,343 | B2 * | 10/2007 | Rodriguez et al. ........... 363/146 |
| 7,505,294 | B2 * | 3/2009 | Ahmed et al. ................ 363/141 |
| 7,869,193 | B2 * | 1/2011 | Nohara et al. ................ 361/624 |

FOREIGN PATENT DOCUMENTS

| JP | 2005-261035 | 9/2005 |
| JP | 2005-347561 | 12/2005 |

* cited by examiner

*Primary Examiner* — Gary L Laxton
(74) *Attorney, Agent, or Firm* — Woodcock Washburn LLP

(57) ABSTRACT

A power converter includes a switching device composed of parallel-connected semiconductor chips evenly divided into two groups. The power converter includes a positive conductor, a capacitor and an output electrode. The positive conductor includes first and second terminal portions. The output electrode includes an end portion joined to a base portion having first and second connecting portions. The output electrode is formed so as to reduce or cancel a difference existing between an inductance L1 of a current path from a positive terminal of the capacitor to the first terminal portion and an inductance L2 of a current path from the positive terminal to the second terminal portion, by providing a difference between an inductance L3 of a current path from the first connecting portion to the end portion and an inductance L4 of a current path from the second connecting portion to the end portion.

11 Claims, 7 Drawing Sheets

POWER CONVERTER

CROSS REFERENCE TO RELATED APPLICATION

This application claims priority to Japanese Application No. 2008-132264 filed May 20, 2008.

BACKGROUND

The present invention relates to a power converter including a power capacitor and a switching device that is composed of parallel-connected semiconductor chips and constitutes each of upper and lower arms.

FIG. 9A is a circuit diagram of a three-phase inverter that converts direct current to alternating current. The inverter has an inverter circuit 62 including six switching devices Q1, Q2, Q3, Q4, Q5 and Q6. The serially connected switching devices Q1 and Q2, Q3 and Q4, and Q5 and Q6 are connected in parallel. Diodes D1, D2, D3, D4, D5 and D6 are inversely connected in parallel to the switching devices Q1, Q2, Q3, Q4, Q5 and Q6, respectively. Each of pairs of the switching device and the diode Q1 and D1, Q3 and D3, and Q5 and D5 is referred to as an upper arm. Each of pairs of the switching device and the diode Q2 and D2, Q4 and D4, and Q6 and D6 is referred to as a lower arm.

Each of the switching devices Q1, Q3 and Q5 has a drain terminal connected to a positive input terminal 64 via a line 63, and each of the switching devices Q2, Q4 and Q6 has a source terminal connected to a negative input terminal 66 via a line 65. Plural capacitors 67 are connected in parallel between the lines 63 and 65. Each capacitor 67 has a positive terminal connected to the line 63 and a negative terminal connected to the line 65. In FIG. 9A, each of the upper and lower arms is composed of one switching device and one diode. In a case of inverter for a large amount of power, each arm is composed of plural pairs of the switching device and the diode connected in parallel, as shown in FIG. 9B.

A node Pu between the switching devices Q1 and Q2 is connected to a U-phase terminal U, a node Pv between the switching devices Q3 and Q4 is connected to a V-phase terminal V, and a node Pw between the switching devices Q5 and Q6 is connected to a W-phase terminal W. Each of the switching devices Q1, Q2, Q3, Q4, Q5 and Q6 has a gate terminal connected to signal terminals G1, G2, G3, G4, G5 and G6, and has a source terminal connected to signal terminals S1, S2, S3, S4, S5 and S6, respectively.

In a power converter, a line inductance needs to be lowered. In addition, when a switching device is composed of plural semiconductor chips connected in parallel, it is important that inductances of respective current paths from the positive terminal of the capacitor to the nodes Pu, Pv and Pw are balanced. In a power converter for a large amount of power, a bus bar is generally used for electrically connecting a capacitor to a circuit pattern on which a semiconductor chip is mounted or a circuit pattern connected to a semiconductor chip by wire bonding.

In a known power converter disclosed in Japanese Unexamined Patent Application Publication No. 2005-261035, bus bars 71 and 72, and switching devices 73 and 74 are provided, as shown in FIG. 10. The bus bar 71 is placed over the bus bar 72. The switching device 73 are arranged so as to overlap the bus bars 71 and 72 in the planar direction, while the switching devices 74 are arranged so as not to overlap the bus bars 71 and 72. Thus, imbalance and excess of peak current between the switching devices 73 and 74 is prevented. The power converter further includes plural driver circuits that operate the respective switching devices. Specifically, each of the driver circuits generates an electrical signal in response to a control signal for turning on or off the corresponding switching device, and then provides the electrical signal to a control electrode of the switching device. In the driver circuit, an impedance of a path through which the electric signal is delivered to the control electrode of the switching device 73 is designed to be larger than an impedance of a path through which the electric signal is delivered to the control electrode of the switching device 74. Alternatively, an impedance between the switching device 73 and the bus bar 71 connected by bonding wires is designed to be larger than an impedance between the switching device 74 and the bus bar 71 connected by bonding wires.

Even when each of upper and lower arms has a switching device composed of large number of semiconductor chips connected in parallel, current and voltage at the respective semiconductor chips need to be balanced. Therefore, it is suggested that the plural semiconductor chips evenly divided into two groups are mounted on different circuit patterns formed on an insulating substrate. In such a case, as schematically shown in FIG. 11, each of the upper arms has two current paths between a positive terminal PT of a capacitor and a node P that is to be connected to an output electrode (not shown). It is noted that two groups of semiconductor chips mounted on different circuit patterns are respectively represented by one switching device Q (MOSFET) in FIG. 11. To equalize the currents flowing through the two current paths, the following equation needs to be satisfied:

$$L1+L3=L2+L4$$

where L1 is an inductance of a current path from the positive terminal PT of the capacitor to the drain terminal of the first group of MOSFET, L2 is an inductance of a current path from the positive terminal PT to the drain terminal of the second group of MOSFET, L3 is an inductance of a current path from the source terminal of the first group of MOSFET to the node P, and L4 is an inductance of a current path from the source terminal of the second group of MOSFET to the node P.

However, when the size of the inverter is reduced, even if the bus bar is merely formed with symmetrically arranged terminal portions joined to the circuit patterns and the positive terminal PT of the capacitor is symmetrically joined to the bus bar, the inductances L1 and L2 are not equalized.

In the power converter disclosed in the reference No. 2005-261035, a mutual inductance is considered between the switching devices 73 and 74. However, the reference No. 2005-261035 does not describe that the difference of the lengths of two current paths from the positive terminal PT to the switching device Q and from the switching device Q to the node P causes the difference of the inductances of the two current paths. In a method of providing plural driver circuits, the structure of the unit becomes complicated and the unit requires an additional space for the driver circuits, resulting in enlargement of the size of the unit. In a method of using bonding wires, on the other hand, an inductance of a current path from the positive terminal of the capacitor to the switching device is considered, but an inductance of a current path from the switching device to the node for the output terminal is not considered.

The present invention is directed to providing a power converter that prevents current and voltage imbalance due to the difference of the lengths of current paths from a capacitor through plural semiconductor chips to a node that is connected to an output electrode.

SUMMARY

In accordance with an aspect of the present invention, a power converter includes a switching device constituting each of upper and lower arms. The switching device is composed of plural semiconductor chips, and the plural semiconductor chips are connected in parallel and evenly divided into a first group and a second group. The power converter includes an insulating substrate having thereon plural circuit patterns, a positive conductor and a negative conductor being insulated from and disposed adjacent to and parallel to each other, and a capacitor having a positive terminal and a negative terminal. The positive terminal of the capacitor is connected to the positive conductor, and the negative terminal of the capacitor is connected to the negative conductor. The power converter includes an output electrode being connected to a node between the upper and lower arms. The positive conductor includes a first terminal portion and a second terminal portion, the first terminal portion is joined to a circuit pattern on which the first group of semiconductor chips is mounted, and the second terminal portion is joined to a circuit pattern on which the second group of semiconductor chips is mounted. The output electrode includes a base portion and an electrode portion, the electrode portion has an end portion being joined to the base portion, the base portion has a first connecting portion and a second connecting portion, the first connecting portion is joined to a circuit pattern that is electrically connected to the first group of semiconductor chips of the upper arm, and the second connecting portion is joined to a circuit pattern that is electrically connected to the second group of semiconductor chips of the upper arm. The output electrode is formed so as to reduce or cancel a difference existing between an inductance L1 of a current path from the positive terminal to the first terminal portion and an inductance L2 of a current path from the positive terminal to the second terminal portion, by providing a difference between an inductance L3 of a current path from the first connecting portion to the end portion and an inductance L4 of a current path from the second connecting portion to the end portion.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF ILLUSTRATIVE EMBODIMENTS

The following will describe a three-phase inverter 11 according to the first embodiment of the present invention with reference to FIGS. 1 through 5.

Figure 1:
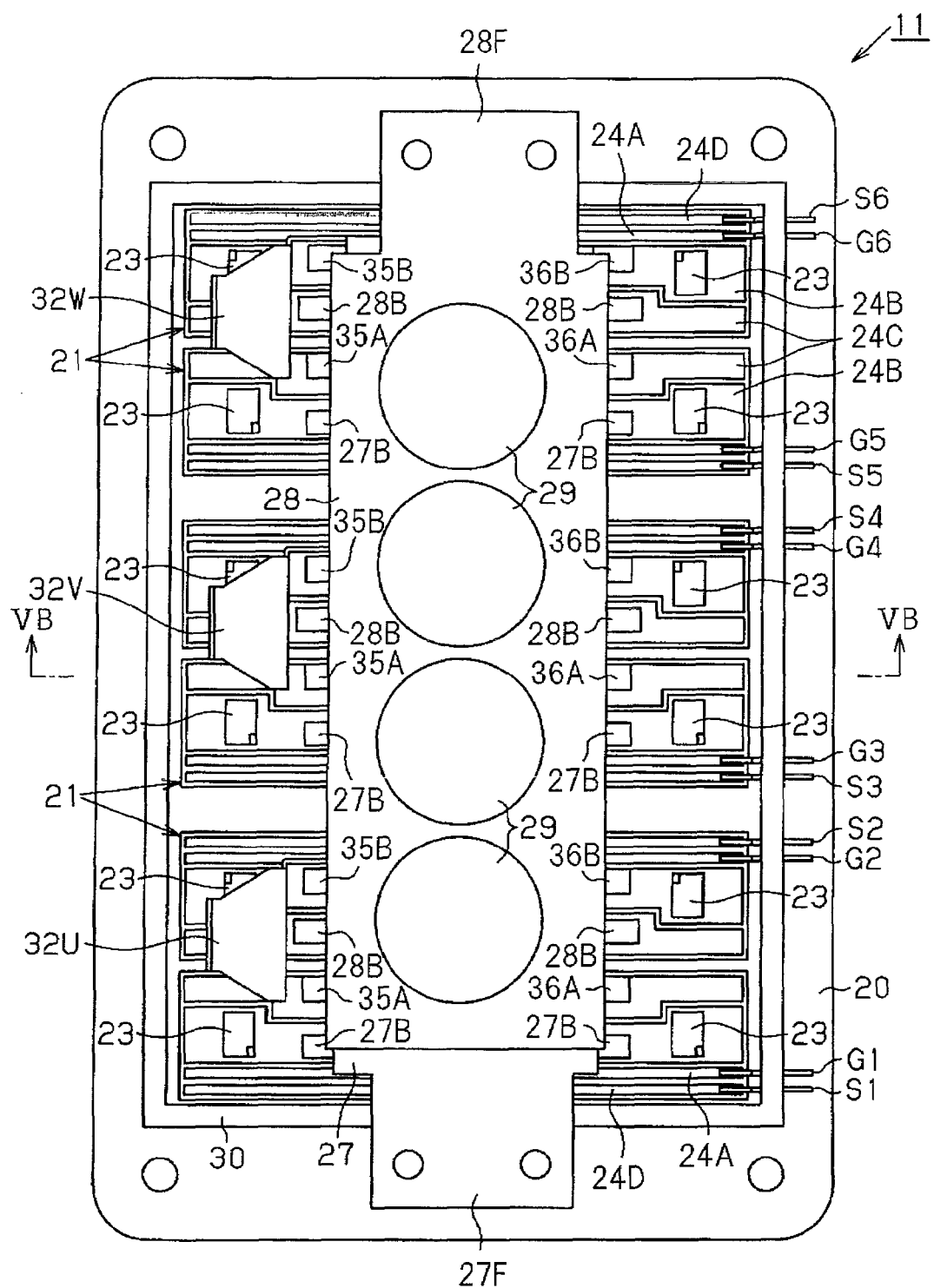
FIG. 1 is a plan view of an inverter according to a first embodiment of the present invention.
Figure 2:
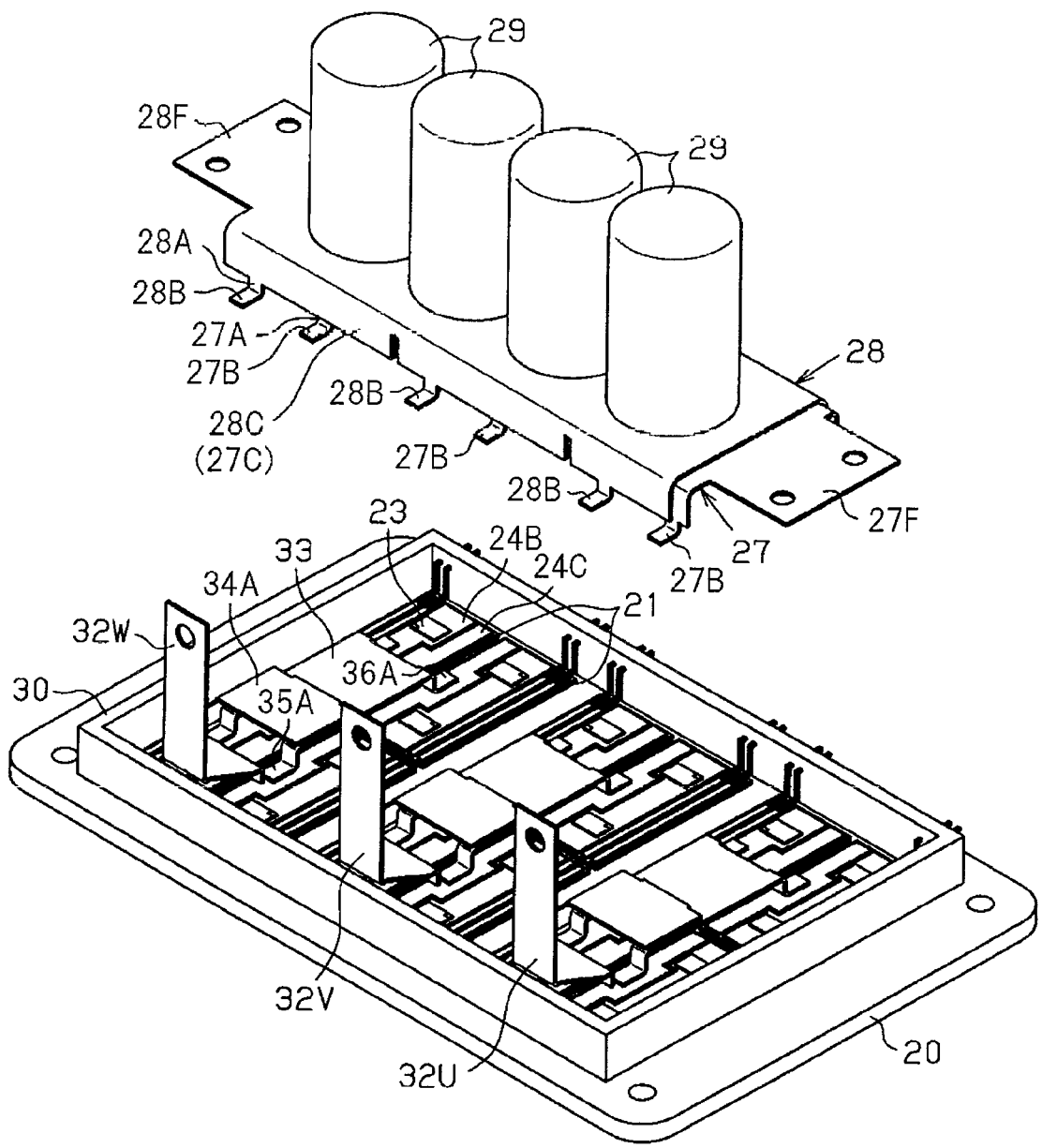
FIG. 2 is an exploded perspective view of the inverter, showing positional relationship of positive and negative conductors, ceramic substrates and output electrodes.
Figure 9A:
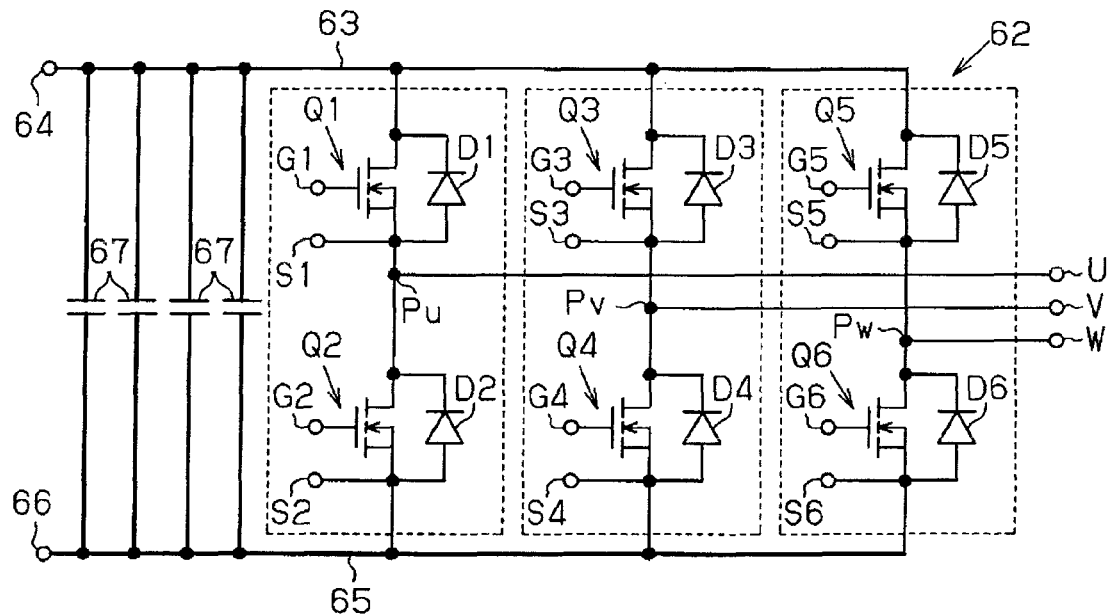
FIG. 9A is a circuit diagram of an inverter.
Figure 9B:
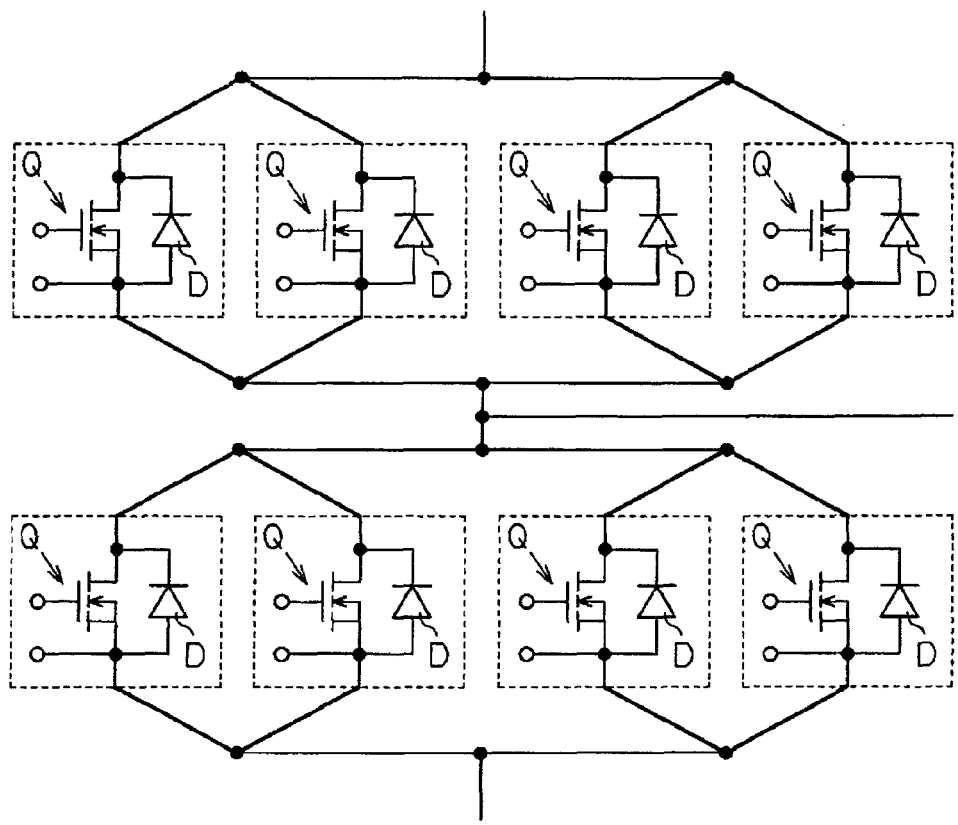
FIG. 9B is an example of a circuit diagram of one arm.
Figure 10:
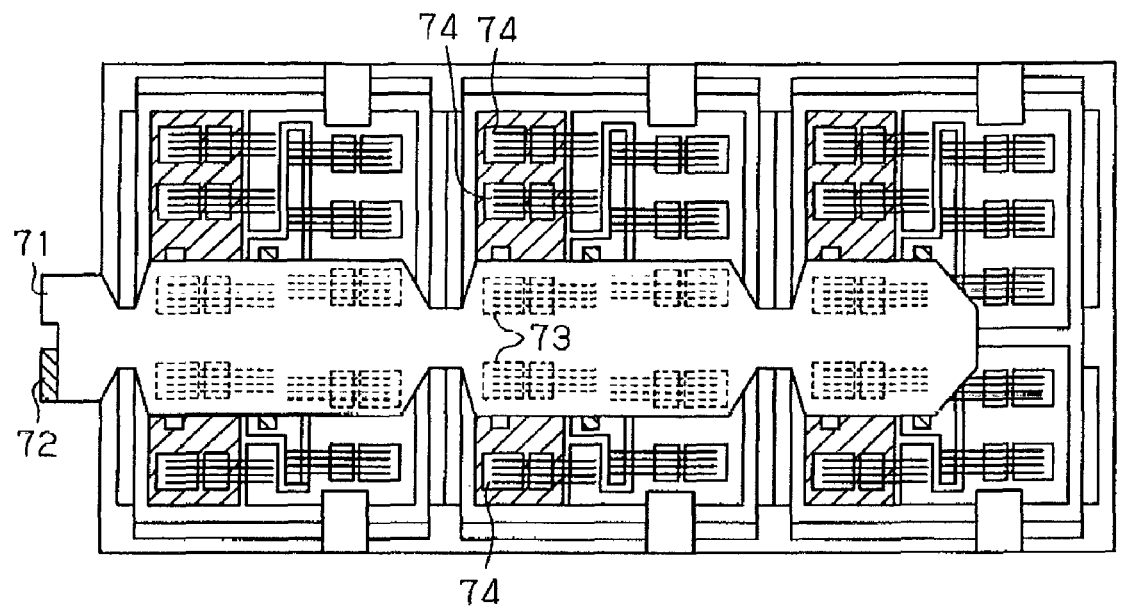
FIG. 10 is a schematic view of a power converter as a background art.
Figure 11:
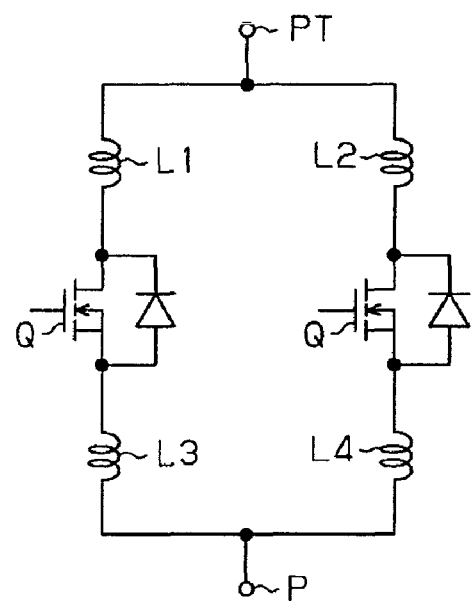
FIG. 11 is a schematic circuit diagram explaining an inductance of a current path from a positive terminal of a capacitor to a node that is to be connected to an output electrode.

Referring to FIGS. 1 and 2, the inverter 11 includes a metal base 20 made of copper, plural ceramic substrates 21 (an insulating substrate) mounted on the metal base 20, and plural semiconductor chips 23 mounted on the ceramic substrates 21. Each semiconductor chip 23 has one switching device (MOSFET) and one diode in combination as a one-chip device. That is, each semiconductor chip 23 has one switching device Q and one diode D of FIG. 9B.

Figure 4:
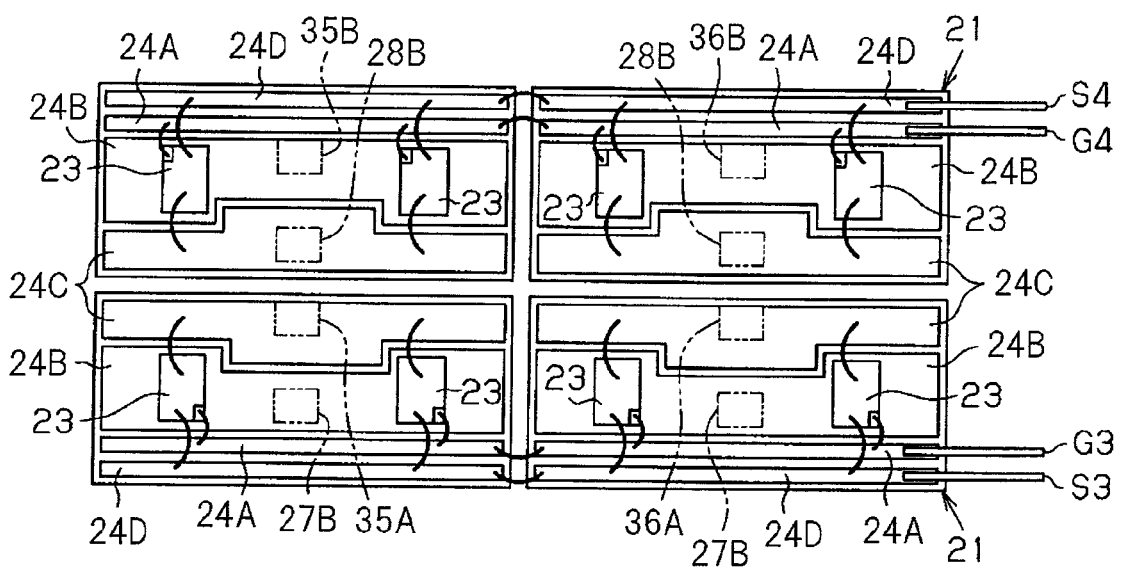
FIG. 4 is a schematic view showing positional relationship of circuit patterns, semiconductor chips, terminal ends of the positive and negative conductors, and connecting portions of the output electrode in a pair of upper and lower arms.
Figure 5A:
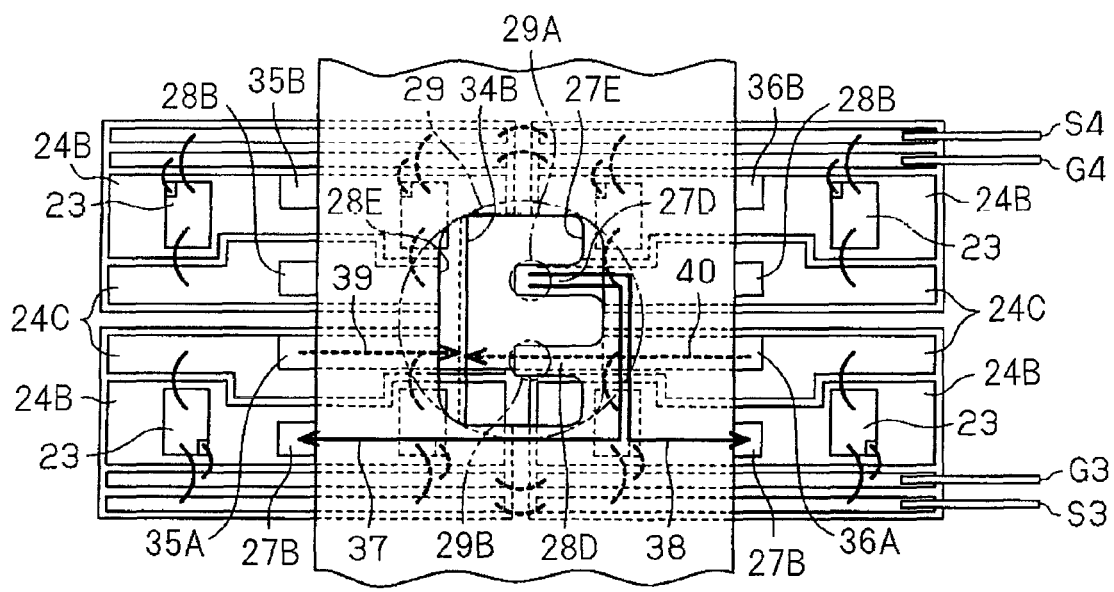
FIG. 5A is a schematic view showing positional relationship of a positive terminal of a capacitor, the terminal ends of the positive and negative conductors, and the connecting portions of the output electrode.
Figure 5B:
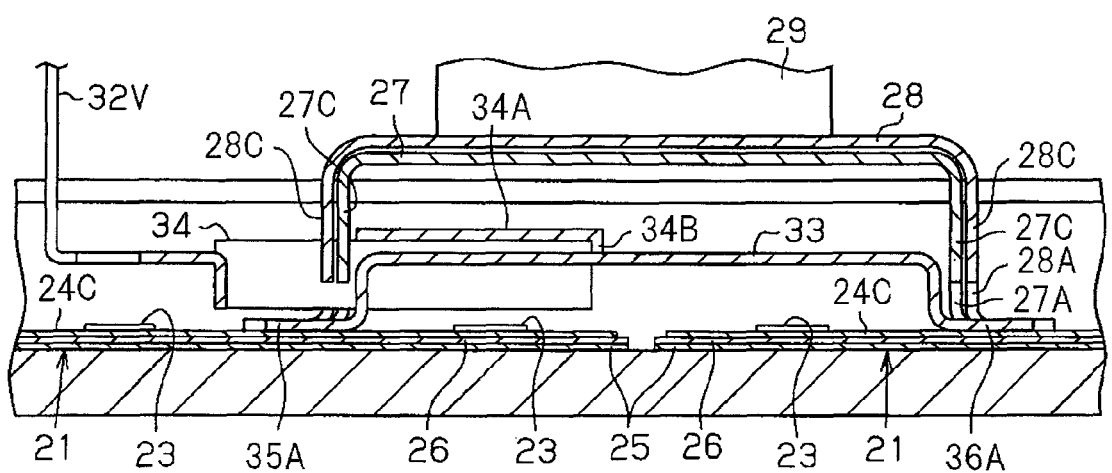
FIG. 5B is a cross-sectional view taken along the line VB-VB of FIG. 1.

Referring to FIGS. 4 and 5B, each ceramic substrate 21 has circuit patterns 24A, 24B, 24C and 24D formed on the upper surface of a ceramic plate 26. The ceramic substrate 21 has a metal plate 25 bonded to the lower surface of the ceramic plate 26. The ceramic plate 26 is made of, for example, aluminum nitride, alumina or silicon nitride. The circuit patterns 24A, 24B, 24C and 24D and the metal plate 25 are made of, for example, aluminum or copper. The ceramic substrate 21 is soldered to the metal base 20 with the metal plate 25. Hereinafter, the metal base 20 is described as the bottom of the inverter 11.

The circuit pattern 24A is for conducting a gate signal, the circuit pattern 24B is for conducting a drain current, the circuit pattern 24C is for conducting a source current, and the circuit pattern 24D is for conducting a source signal. Each of the circuit patterns 24A, 24B, 24C and 24D is generally in the form of a strip. The semiconductor chip 23 is mounted on the circuit pattern 24B by soldering. As shown in FIG. 4, the gate of the semiconductor chip 23 is electrically connected to the circuit pattern 24A by wire bonding, and the source of the semiconductor chip 23 is electrically connected to the circuit patterns 24C and 24D by wire bonding.

Referring to FIGS. 1 and 2, each of the metal base 20 and the ceramic substrates 21 has a generally rectangular shape. A total of twelve ceramic substrates 21 are arranged in six rows and two columns on the metal base 20 so that longitudinal directions of the ceramic substrate 21 and the metal base 20 are perpendicular to each other. Each of upper and lower arms of the inverter circuit is composed of the semiconductor chips 23 mounted on two ceramic substrates 21 arranged in each row, and the upper and lower arms are arranged alternately in the longitudinal direction of the metal base 20. In the present embodiment, as shown in FIG. 4, each ceramic substrate 21 has two semiconductor chips 23 and, therefore, each arm is composed of four semiconductor chips 23. That is, each of the upper and lower arms has a switching device composed of plural semiconductor chips 23 connected in parallel, and the plural semiconductor chips 23 are evenly divided into two groups and mounted on the respective circuit patterns 24B of the ceramic substrates 21 arranged in each row. The semiconductor chips 23 mounted on the circuit pattern 24B are spaced away from each other in longitudinal direction of the circuit pattern 24B.

The inverter 11 includes a positive conductor 27, a negative conductor 28 and four power capacitors 29 (hereinafter referred to as a capacitor 29). The positive and negative conductors 27 and 28 are made of a conductive plate and arranged above the metal base 20. The positive and negative conductors 27 and 28 are disposed adjacent to each other and respectively extend parallel to the ceramic substrates 21. The positive and negative conductors 27 and 28 are insulated from each other through an insulator (not shown) interposed therebetween. In the present embodiment, the negative conductor 28 is placed over the positive conductor 27. The capacitors 29 are arranged on the negative conductor 28 with the positive and negative terminals thereof facing downward. The positive and negative conductors 27 and 28 serve as the lines 63 and 65 of FIG. 9A, respectively.

The positive conductor 27 is connected to the positive terminal of the capacitor 29, and the negative conductor 28 is connected to the negative terminal of the capacitor 29. The positive conductor 27 includes three pairs of terminal portions 27A that extend from both end sides of the positive conductor 27 toward the ceramic substrates 21. The terminal portion 27A is then bent as to extend parallel to the upper surface of the positive conductor 27 to form a terminal end 27B that is joined to the circuit pattern 24B. As with the positive conductor 27, the negative conductor 28 also includes similar terminal portions 28A having terminal ends 28B. The terminal ends 27B and 28B are mounted on the middle of the circuit patterns 24B and 24C by ultrasonic bonding, respectively.

That is, the positive conductor 27 is electrically connected through the terminal portions 27A to the respective circuit patterns 24B on which the two groups of the semiconductor chips 23 are mounted. The negative conductor 28 is electrically connected through the terminal portions 28A to the respective circuit patterns 24C to which the two groups of the semiconductor chips 23 are electrically connected by wire bonding. Specifically, the positive conductor 27 includes a first group of terminal portions 27A and a second group of terminal portions 27A. The first group of terminal portions 27A (a first terminal portion) is joined to the circuit patterns 24B on which a first group of semiconductor chips 23 are mounted. The second group of terminal portions 27A (a second terminal portion) is joined to the circuit patterns 24B on which a second group of semiconductor chips are mounted.

The positive and negative conductors 27 and 28 further include side portions 27C and 28C from which the terminal portions 27A and 28A extend downward, respectively. The side portions 27C and 28C are disposed adjacent to each other.

Referring to FIGS. 1 and 2, a non-conductive frame 30 of a rectangular shape is mounted around the ceramic substrates 21 on the metal base 20. A positive input terminal 27F is formed at a longitudinal end of the positive conductor 27 so as to extend outward of the frame 30. A negative input terminal 28F is formed at a longitudinal end of the negative conductor 28 opposite from the positive input terminal 27F so as to extend outward of the frame 30.

The inverter 11 includes three output electrodes 32U, 32V and 32W having a generally L shape as viewed in the longitudinal direction of the metal base 20. Horizontal portions of the output electrodes 32U, 32V and 32W extend below the positive conductor 27 in a direction that is perpendicular to longitudinal direction of the positive conductor 27. Vertical portions of the output electrodes 32U, 32V and 32W extend upward at a position near the wall of the frame 30.

Figure 3:
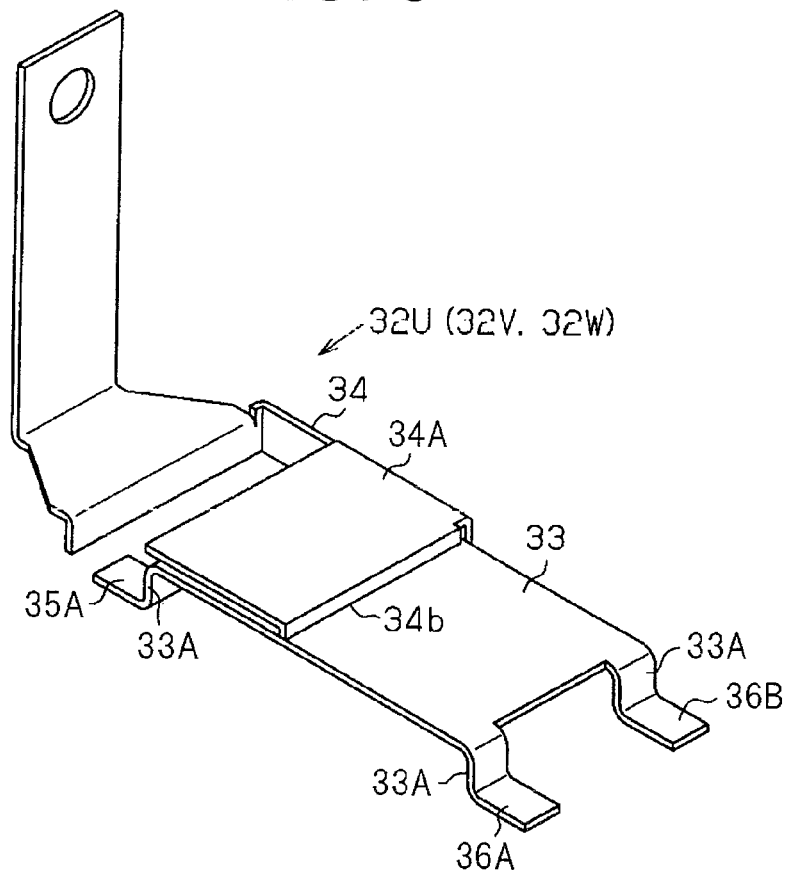
FIG. 3 is a perspective view of the output electrode.

The output electrodes 32U, 32V and 32W are made of a conductive plate and have a similar shape. Referring to FIG. 3, each of the output electrodes 32U, 32V and 32W includes a rectangular base portion 33 and an L-shaped electrode portion 34. The base portion 33 has at the four corners thereof L-shaped supports 33A. The electrode portion 34 has a planar portion 34A extending parallel to the upper surface of the base portion 33. The planar portion 34A has an end portion 34B joined to the upper surface of the base portion 33. That is, the end portion 34B is a junction of the electrode portion 34 and the base portion 33.

Referring to FIGS. 1 and 3, the long side of the base portion 33 of the output electrode 32U (32V, 32W) is a little shorter than the width of the positive conductor 27, and the short side of the base portion 33 is approximately as long as the width of the ceramic substrate 21. The base portion 33 is formed with a first connecting portion 35A, a second connecting portion 36A, a third connecting portion 35B and a fourth connecting portion 36B. The first and second connecting portions 35A and 36A are provided on the right side of the base portion 33 as seen from the side of the electrode portion 34. The first connecting portion 35A is mounted on the circuit pattern 24C that is electrically connected to the first group of semiconductor chips 23 of the upper arm. The second connecting portion 36A is mounted on the circuit pattern 24C that is electrically connected to the second group of semiconductor chips 23 of the upper arm. The third and fourth connecting portions 35B and 36B are provided on the left side of the base portion 33 as seen from the side of the electrode portion 34. The third connecting portion 35B is mounted on the circuit pattern 24B where the first group of semiconductor chips 23 of the lower arm is mounted. The fourth connecting portion 36B is mounted on the circuit pattern 24B where the second group of semiconductor chips 23 of the lower arm is mounted. The first, second, third and fourth connecting portions 35A, 36A, 35B and 36B are formed at the lower ends of the respective supports 33A of the base portion 33. The first and third connecting portions 35A and 35B are formed in the base portion 33 near the electrode portion 34, while the second and fourth connecting portions 36A and 36B are formed in the base portion 33 away from the electrode portion 34.

In each of the output electrodes 32U, 32V and 32W, the length of a current path from the first connecting portion 35A to the end portion 34B depends on the position of the end portion 34B relative to the base portion 33. Similarly, the length of a current path from the second connecting portion 36A to the end portion 34B also depends on the position of the end portion 34B. That is, the displacement of the end portion 34B from the center of the base portion 33 causes the difference between an inductance L3 of a current path from the first connecting portion 35A to the end portion 34B and an inductance L4 of a current path from the second connecting portion 36A to the end portion 34B. In each of the output electrodes 32U, 32V and 32W, the planar portion 34A is formed so as not to extend over the first and third connecting portions 35A and 35B, the process of mounting the first and third connecting portions 35A and 35B is not prevented, accordingly.

Referring to FIG. 1, the first and second connecting portions 35A and 36A of the output electrode 32U are mounted by ultrasonic bonding on the circuit patterns 24C of the upper arm composed of the switching device Q1 and the diode D1. The third and fourth connecting portions 35B and 36B of the output electrode 32U are mounted by ultrasonic bonding on the circuit patterns 24B of the lower arm composed of the switching device Q2 and the diode D2. The first and second connecting portions 35A and 36A of the output electrode 32V are mounted by ultrasonic bonding on the circuit patterns 24C of the upper arm composed of the switching device Q3 and the diode D3. The third and fourth connecting portions 35B and 36B of the output electrode 32V are mounted by ultrasonic bonding on the circuit patterns 24B of the lower arm composed of the switching device Q4 and the diode D4. The first and second connecting portions 35A and 36A of the output electrode 32W are mounted by ultrasonic bonding on the circuit patterns 24C of the upper arm composed of the switching device Q5 and the diode D5. The third and fourth connecting portions 35B and 36B of the output electrode 32W are mounted by ultrasonic bonding to the circuit patterns 24B of the lower arm composed of the switching device Q6 and the diode D6.

Referring to FIGS. 1 and 4, signal terminals G1, G2, G3, G4, G5 and G6 are connected to the respective circuit patterns 24A of the ceramic substrates 21 adjacent to the bonding portion of the second and fourth connecting portions 36A and 36B of the output electrodes 32U, 32V and 32W. Signal terminals S1, S2, S3, S4, S5 and S6 are connected to the respective circuit patterns 24D of the ceramic substrates 21 adjacent to the bonding portion of the second and fourth connecting portions 36A and 36B of the output electrodes 32U, 32V and 32W. The signal terminals G1 through G6 and S1 through S6 are molded integrally with the frame 30, projecting outward of the frame 30. As shown in FIG. 4, two adjacent circuit patterns 24A of the ceramic substrates 21 of each arm are connected to each other by wire bonding, and two adjacent circuit patterns 24D of the ceramic substrates 21 of each arm are connected to each other by wire bonding.

The frame 30 is filled with silicone gel (not shown) for insulating and protecting the semiconductor chips 23 and for insulating the positive conductor 27 from the output electrodes 32U, 32V and 32W.

FIG. 5A is a schematic view showing positional relationship of the ceramic substrates 21 and the semiconductor chips 23 in a pair of upper and lower arms, the terminal ends 27B and 28B of the positive and negative conductors 27, 28, and the positive and negative terminals 29A and 29B of the capacitor 29. The positive and negative terminals 29A and 29B of the capacitor 29 are aligned in the longitudinal direction of the positive and negative conductors 27 and 28, which is the vertical direction of the FIG. 5A. The positive and negative conductors 27 and 28 are formed with capacitor terminals 27D and 28D that are electrically connected to the positive and negative terminals 29A and 29B of the capacitor 29, respectively. The capacitor terminals 27D and 28D extend in a direction that is perpendicular to the longitudinal direction of the positive and negative conductors 27 and 28. The capacitor terminals 27D and 28D are defined by openings 27E and 28E formed in the positive and negative conductor 27 and 28, and connected to the inner edge thereof, respectively. Therefore, as shown by solid arrows in FIG. 5, there is a difference between the lengths of current paths 37 and 38 from the positive terminal 29A of the capacitor 29 to the respective terminal ends 27B of the upper arm. That is, an inductance L1 of a current path from the positive terminal 29A to the drains of the first group of semiconductor chip 23 differs from an inductance L2 of a current path from the positive terminal 29A to the drains of the second group of semiconductor chip 23.

Such difference of the lengths of two current paths causes current and voltage imbalance at the respective semiconductor chips 23. Therefore, the inductance L3 of a current path 39 from the first connecting portion 35A to the end portion 34B and the inductance L4 of a current path 40 from the second connecting portion 36A to the end portion 34B need to be properly determined. The current paths 39 and 40 are shown by dashed arrows. In each of the output electrodes 32U, 32V and 32W, the position of the end portion 34B relative to the upper surface of the base portion 33 is determined so that the current and voltage imbalance due to the difference of the lengths of the current paths is prevented. Specifically, the output electrodes 32U, 32V and 32W are formed so as to satisfy a relation of each inductance L1, L2, L3 and L4 as shown in the following equation:

$$L1+L3=L2+L4.$$

In the present embodiment, since the inductance L1 is larger than the inductance L2, the inductance L3 is set to be smaller than the inductance L4. Specifically, the end portion 34B is joined to the base portion 33 so that the length of the current path 39 becomes shorter than the length of the current path 40. In addition, the electrode portion 34 has the planar portion 34A disposed adjacent to and parallel to the base portion 33 at the side of the first and third connecting portions 35A and 35B (see FIGS. 3 and 5B), the inductance L3 becomes smaller because of a mutual inductance when current flows from the connecting portion 35A to the planar portion 34A through the end portion 34B, accordingly. Therefore, it is preferable that the position of the end portion 34B is determined not only by considering the difference of the lengths of the current paths 39 and 40, but also by considering a mutual inductance of the current path 39 or a mutual inductance between the electrode portion 34 and the positive conductor 27.

The following will describe the operation of the inverter 11. The inverter 11 is used as, for example, a part of a vehicle power supply. Referring to FIG. 1, the positive and negative input terminals 27F and 28F are connected to a DC power supply (not shown), the output electrodes 32U, 32V and 32W are connected to a motor (not shown), and the signal terminals G1 through G6 and S1 through S6 are connected to a controller (not shown).

When the switching devices Q1, Q3 and Q5 of the upper arms and the switching devices Q2, Q4 and Q6 of the lower arms are turned on or off in a given cycle, AC power is supplied to the motor, and the motor is driven, accordingly.

Such switching operation of the switching devices Q1 through Q6 causes a rapid rise or fall of currents flowing through the positive and negative conductors 27 and 28 in opposite directions. Since the positive and negative conductors 27 and 28 both have a plate shape and disposed parallel to and adjacent to each other, the line inductance is lowered because of the mutual inductance. In addition, the side portions 27C and 28C of the positive and negative conductors 27 and 28 are also disposed parallel to and adjacent to each other, and the line inductance is less, accordingly, as compared to a case wherein such paralleled side portions are not provided.

Referring to FIGS. 1, 4 and 5A, each of the switching devices Q1 through Q6 is composed of parallel-connected semiconductor chips 23 mounted on two circuit patterns 24B of the ceramic substrates 21. The inductance L1 of the current path 37 is larger than the inductance L2 of the current path 38, but the inductances L3 and L4 of the current paths 39 and 40 are determined so as to satisfy the relation of L1+L3=L2+L4. Therefore, it can prevent the inverter 11 from causing current and voltage imbalance at a current path from the positive terminal 29A of the capacitor 29 through the semiconductor chips 23 to the end portion 34B of the electrode portion 34 in each upper arm.

The inverter 11 according to the first embodiment has the following advantages.

(1) Each of the switching devices of the upper arms is composed of parallel-connected semiconductor chips 23. The plural semiconductor chips 23 are evenly divided into two groups and mounted on the different circuit patterns 24B of the ceramic substrates 21. The positive conductor 27 is electrically connected through the different terminal portions 27A to the respective circuit patterns 24B on which the two groups of semiconductor chips 23 are mounted. Therefore, there are two current paths between the positive terminal 29A of the capacitor 29 and the end portion 34B of the output electrode 32U (32V, 32W). Specifically, one of the current paths is the current path 37 from the positive terminal 29A to the terminal portion 27A (a first terminal portion) that is joined to the circuit pattern 24B on which the first group of semiconductor chips 23 are mounted. The other of the current paths is the current path 38 from the positive terminal 29A to the different terminal portion 27A (a second terminal portion) that is joined to the circuit pattern 24B on which the second group of semiconductor chips 23 are mounted. In the present embodiment, the inductance L1 of the current path 37 is larger than the inductance L2 of the current path 38, but the output electrodes 32U, 32V and 32W are formed so as to satisfy the relation of L1+L3=L2+L4, where L3 is an inductance of the current path 39 from the first connecting portion 35A to the end portion 34B of the electrode portion 34, and L4 is an inductance of the current path 40 from the second connecting portion 36A to the end portion 34B. Thus, it can prevent the inverter 11 from causing current and voltage imbalance due to the difference of the lengths of two current paths from the capacitor 29 through the semiconductor chips 23 to the end portion 34B of each of the output electrodes 32U, 32V and 32W. In addition, the inductance L3 and the inductance L4 are easily adjusted only by changing the shape of the output electrodes 32U, 32V and 32W.

(2) In each of the output electrodes 32U, 32V and 32W, the end portion 34B of the electrode portion 34 is joined to the upper surface of the base portion 33. The displacement of the end portion 34B from the center of the base portion 33 results in the difference between the inductance L3 and the inductance L4. Therefore, the inductances L3 and L4 are easily differentiated from each other only by changing the position of the end portion 34B, and the inductances L3 and L4 can be properly determined depending on the position of the end portion 34B, accordingly.

(3) In each of the output electrodes 32U, 32V and 32W, since the electrode portion 34 has the planar portion 34A disposed adjacent to and parallel to the base portion 33, the inductance L3 becomes smaller because of the mutual inductance. Specifically, the value of inductance L3 is determined by the length of a current path that is shorter than the actual current path 39. Therefore, the inductance L3 can be adjusted only by changing the position of the end portion 34B of the electrode portion 34 slightly, as compared to a case wherein there is less or no mutual inductance between the electrode portion 34 and the base portion 33.

(4) In each of the output electrodes 32U, 32V and 32W, the first, second, third and fourth connecting portions 35A, 36A, 35B and 36B are formed in the common base portion 33. Therefore, the structure of the base portion 33 becomes simple to allow a large amount of current to flow therethrough, as compared to a case wherein a pair of the first and second connecting portions 35A and 36A and a pair of the third and fourth connecting portions 35B and 36B are separately formed in different base portions.

(5) In each of the output electrodes 32U, 32V and 32W, the planar portion 34A of the electrode portion 34 is formed so as not to extend over the first and third connecting portions 35A and 35B of the base portion 33. Therefore, the process of mounting the first and third connecting portions 35A and 35B is not prevented, and the first and third connecting portions 35A and 35B can be easily mounted on the corresponding circuit patterns 24B and 24C by ultrasonic bonding.

(6) Each of the switching devices of the lower arms is composed of parallel-connected semiconductor chips 23. The plural semiconductor chips 23 are evenly divided into two groups and mounted on the different circuit patterns 24B. The negative terminal 29B of the capacitor 29 is connected to the capacitor terminal 28D of the negative conductor 28, as in the case of the positive terminal 29A of the capacitor 29 connected to the capacitor terminal 27D of the positive conductor 27. In each of the output electrodes 32U, 32V and 32W, the third and fourth connecting portions 35B and 36B are mounted on the circuit patterns 24B, as in the case of the first and second connecting portions 35A and 36A mounted on the circuit patterns 24C. Therefore, it can prevent the inverter 11 from causing current and voltage imbalance in the lower arm due to the difference of the lengths of the current paths from the end portion 34B of the electrode portion 34 through the semiconductor chips 23 to the negative terminal 29B of the capacitor 29.

Figure 6:
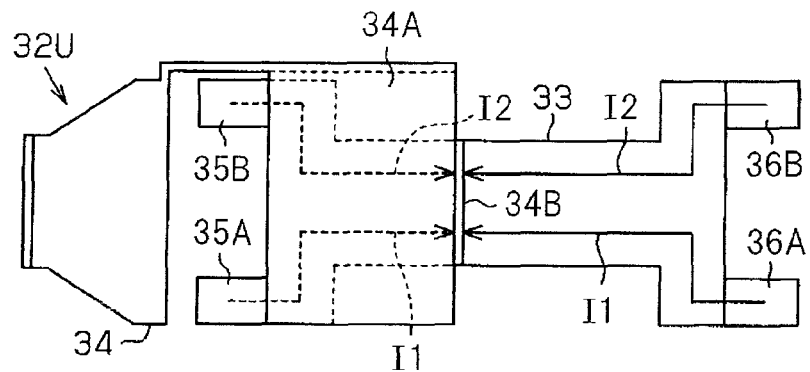
FIG. 6 is a plan view of an output electrode according to a second embodiment of the invention.
Figure 7:
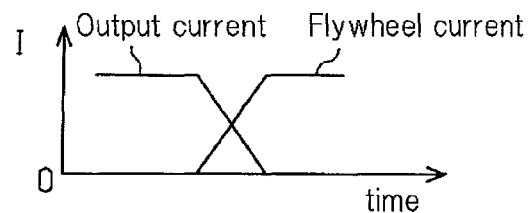
FIG. 7 is a graph schematically showing a variation of an output current and a flywheel current.

The following will describe the second embodiment of the present invention with reference to FIGS. 6 and 7. The second embodiment differs from the first embodiment only in the shape of the base portion 33 of the respective output electrodes 32U, 32V and 32W. In FIG. 6, same reference numbers are used for the common elements or components in the first and second embodiments, and the description of such elements or components will be omitted. Referring to FIG. 6, the width of the middle portion of the base portion 33 of the output electrode 32U is narrowed between the first, third connecting portions 35A, 35B and the second, fourth connecting portions 36A, 36B. The narrowed portion has a larger thickness so as to prevent the electric resistance of the output electrode 32U from increasing due to the narrowed width.

In the inverter 11, the output electrodes 32U, 32V and 32W are connected to the respective nodes between the upper and lower arms. Each of the output electrodes 32U, 32V and 32W serves as not only a current path from the node between the upper and lower arms to a load (a motor), but also part of a current path from the load to the negative terminal of the capacitor. For example, referring to FIG. 9A, when the switching devices Q1 and Q4 are turned on, a current flows through the switching device Q1, the U-phase terminal U and a load (motor). The current then flows through the V-phase terminal V and the switching device Q4 and back to the capacitor 67.

In a pair of the upper and lower arms, when the switching device of the upper arm is turned off, a flywheel current flows through the diode inversely connected in parallel to the switching device of the lower arm. Therefore, as shown in FIG. 7, the amount of an output current I1 flowing through the base portion 33 from the first and second connecting portions 35A and 36A toward the end portion 34B is gradually decreased and then becomes zero. On the other hand, the amount of a flywheel current I2 flowing from the third and fourth connecting portions 35B and 36B toward the end portion 34B is gradually increased. Finally, the flywheel current I2 also becomes zero. The output current I1 and the flywheel current I2 flow in the same direction. The output current I1 is gradually decreased, while the flywheel current I2 is gradually increased. The current paths of the output current I1 and flywheel current I2 come close to and extend parallel to each other on the base portion 33, and the inductance is lowered by interaction of the output current I1 and the flywheel current I2, accordingly.

The second embodiment has the following advantages in addition to the advantages of the first embodiment.

(7) The distance between a shortest current path from the first connecting portion 35A to the end portion 34B and a shortest current path from the third connecting portion 35B to the end portion 34B is smaller than the distance between the first and third connecting portions 35A and 35B. The distance between a shortest current path from the second connecting portion 36A to the end portion 34B and a shortest current path from the fourth connecting portion 36B to the end portion 34B is smaller than the distance between the second and fourth connecting portions 36A and 36B. Therefore, in a pair of the upper and lower arms, when the switching device of the upper arm is turned off, the inductance is lowered by interaction of the output current i1 and flywheel current i2 flowing through the base portion 33.

(8) The width of the middle portion of the base portion 33 is narrowed between the first and second connecting portions 35A and 36A. Therefore, the current paths of the output current i1 and the flywheel current i2 come close to and extend parallel to each other.

(9) The width of the middle portion of the base portion 33 is narrowed between the first and second connecting portions 35A and 36A, but the narrowed portion has a larger thickness. Therefore, an increase in electric resistance due to the narrowed width is prevented, and generation of heat is prevented, accordingly.

The above embodiments may be modified in various ways as exemplified below.

Figure 8A:
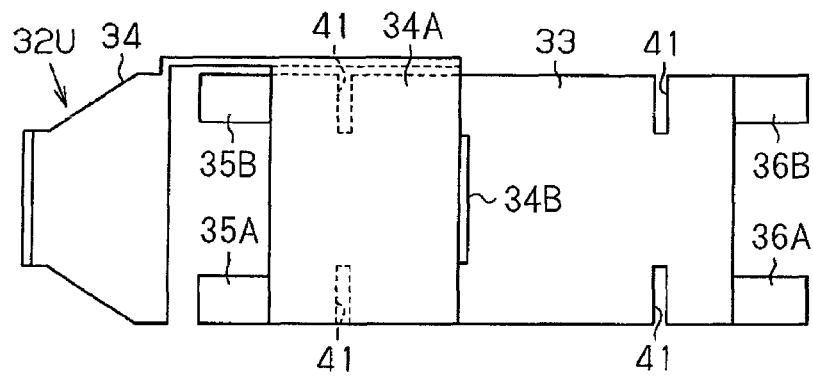
FIG. 8A is a plan view of an output electrode of other embodiments.

In the second embodiment, the width of the middle portion of the base portion 33 is narrowed between the first and second connecting portions 35A and 36A so as to lower the inductance. Alternatively, the base portion 33 may have cutouts 41 near the first, third, second and fourth connecting portions 35A, 35B, 36A, 36B, as shown in FIG. 8A. In such a case, since the current paths of the output current I1 and the flywheel current I2 come close to each other (see FIG. 6), the inductance can be lowered by interaction of the output current I1 and flywheel current I2. In addition, the degree of the interaction can be easily adjusted by changing the length or width of the cutout 41. In FIG. 8A, the width of the end portion 34B is smaller than the width of the base portion 33. Alternatively, the width of the end portion 34B may be as long as the width of the base portion 33.

Figure 8B:
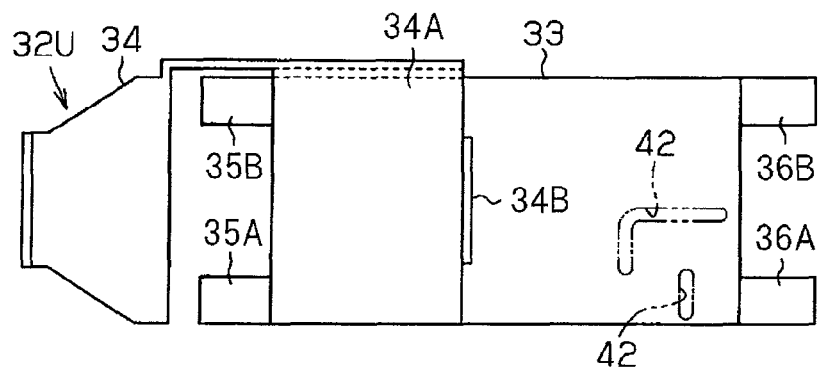
FIG. 8B is a plan view of an output electrode of other embodiments.

The width of the end portion 34B may be smaller than the width of the base portion 33 so that the current paths of the output current I1 and flywheel current I2 come close to each other, as shown in FIGS. 8A and 8B. In such a case, the current paths of the output current I1 and flywheel current I2 flowing through the base portion 33 easily come close to each other without changing the shape of the base portion 33.

The base portion 33 may have an opening near the second connecting portion 36A so as to increase the inductance L4 of the current path 40 (see FIG. 5A). For example, an opening 42 can be formed so as to increase the length of a current path from the second connecting portion 36A to the end portion 34B, as shown in FIG. 8B. In addition to the opening 42, a cutout may be formed in the base portion 33. In such a case, the inductance L4 can be adjusted by providing the opening 42, without changing the position of the end portion 34B.

In addition to the change of the position of the end portion 34B, the opening 42 or a cutout may be formed in the base portion 33 so as to increase the inductance L4 of a current path from the second connecting portion 36A to the end portion 34B. Such opening 42 or a cutout can be used for fine adjustment of the inductance L4 when the desired value of the inductance L4 is not obtained only by changing the position of the end portion 34B, The inductances L1 and L2 of the current paths 37 and 38 in the positive conductor 27 and the inductances L3 and L4 of the current paths 39 and 40 in the output electrodes 32U, 32V and 32W are need to be determined so as to satisfy the relation of L1+L3=L2+L4. However, the inductance L3 may be set to be equal to or larger than the inductance L4. For example, when the inductance L1 is smaller than the inductance L2, the position of the end portion 34B of the electrode portion 34 or the shape of the base portion 33 are determined so that the inductance L3 becomes larger than the inductance L4. When the inductance L1 is equal to the inductance L2, such factors are determined so that the inductance L3 becomes equal to the inductance L4.

In the previous embodiments, the planar portion 34A of the electrode portion 34 is disposed adjacent to and parallel to the upper surface of the base portion 33 so that the inductance L3 of the current path 39 becomes lower because of a mutual inductance. Alternatively, the inductance L3 may not need to be lowered by the mutual inductance. For example, the electrode portion 34 may have a planar portion being spaced away from the upper surface of the base portion 33 and extending parallel to the base portion 33.

In the previous embodiments, the first, second, third and fourth connecting portions 35A, 36A, 35B and 36B are formed in the common base portion 33. Alternatively, the first and second connecting portions 35A and 36A may be formed in a first base portion, and the third and fourth connecting portions 35B and 36B may be formed in a second base portion that is separately from the first base portion.

In the previous embodiments, the planar portion 34A is formed so as not to extend over the first and third connecting portions 35A and 35B. Alternatively, a larger planar portion being formed with an opening may be disposed over the first and third connecting portions 35A and 35B so that the opening faces with the first and third connecting portions 35A and 35B.

The number of the pairs of the switching device Q and the diode D in each arm may be less than or more than four, depending on the amount of current flowing through the arm. The number of the capacitors 29 may be less than or more than four, depending on the rated current of the inverter 11 and the capacitance of the capacitor 29.

The ceramic substrate 21 may be replaced with a metal substrate having an insulation layer on which the circuit patterns 24A, 24B, 24C and 24D are formed.

In the previous embodiments, the switching device of each arm is composed of parallel-connected semiconductor chips 23, and the semiconductor chips 23 are evenly divided into two groups and mounted on the different circuit patterns 24B respectively formed on two ceramic substrates 21. Alternatively, the plural semiconductor chips 23 may be mounted on the different circuit patterns 24B formed on one ceramic substrate. In such a case, for example, the one ceramic substrate can be formed so as to have the length twice as long as the length of the ceramic substrate 21 and to have thereon two pairs of the circuit patterns 24B and 24C and a pair of the circuit patterns 24A and 24D.

The inverter 11 may be composed of two pairs of the upper and lower arms for generating single-phase AC.

Power transistors such as an insulated-gate bipolar transistor (IGBT) or a thyristor may be used for the semiconductor chip 23.

Therefore, the present examples and embodiments are to be considered as illustrative and not restrictive, and the invention is not to be limited to the details given herein but may be modified within the scope of the appended claims.

What is claimed:

1. A power converter, comprising:
a switching device constituting each of upper and lower arms, the switching device being composed of plural semiconductor chips, the plural semiconductor chips being connected in parallel and evenly divided into a first group and a second group;
an insulating substrate having thereon plural circuit patterns;
a positive conductor and a negative conductor being insulated from and disposed adjacent to and parallel to each other;
a capacitor having a positive terminal and a negative terminal, the positive terminal being connected to the positive conductor, the negative terminal being connected to the negative conductor; and
an output electrode being connected to a node between the upper and lower arms,
wherein the positive conductor includes a first terminal portion and a second terminal portion, the first terminal portion is joined to a circuit pattern on which the first group of semiconductor chips are mounted, and the second terminal portion is joined to a circuit pattern on which the second group of semiconductor chips are mounted,
wherein the output electrode includes a base portion and an electrode portion, the electrode portion has an end portion being joined to the base portion, the base portion has a first connecting portion and a second connecting portion, the first connecting portion is joined to a circuit pattern that is electrically connected to the first group of semiconductor chips of the upper arm, and the second connecting portion is joined to a circuit pattern that is electrically connected to the second group of semiconductor chips of the upper arm,
wherein the output electrode is formed so as to reduce or cancel a difference existing between an inductance $L1$ of a current path from the positive terminal to the first terminal portion and an inductance $L2$ of a current path from the positive terminal to the second terminal portion, by providing a difference between an inductance $L3$ of a current path from the first connecting portion to the end portion and an inductance $L4$ of a current path from the second connecting portion to the end portion.

2. The power converter according to claim 1, wherein the output electrode is formed so as to satisfy a relation of $L1+L3=L2+L4$.

3. The power converter according to claim 1, wherein the end portion is connected to the upper surface of the base portion, the displacement of the end portion from the center of the upper surface of the base portion results in the difference between the inductance $L3$ and the inductance $L4$.

4. The power converter according to claim 3, wherein the electrode portion has a planar portion being disposed adjacent to and parallel to the base portion at the side of the first connecting portion.

5. The power converter according to claim 4, wherein a mutual inductance occurs between the planar portion and the base portion.

6. The power converter according to claim 1, wherein the base portion has an opening near the second connecting portion so as to increase the inductance $L4$.

7. The power converter according to claim 1, wherein the base portion further has a third connecting portion and a fourth connecting portion, the third connecting portion is joined to a circuit pattern that is electrically connected to the first group of semiconductor chips of the lower arm, the fourth connecting portion is joined to a circuit pattern that is electrically connected to the second group of semiconductor chips of the lower arm, wherein the distance between a shortest current path from the first connecting portion to the end portion and a shortest current path from the third connecting portion to the end portion is smaller than the distance between the first and third connecting portions, and the distance between a shortest current path from the second connecting portion to the end portion and a shortest current path from the fourth connecting portion to the end portion is smaller than the distance between the second and fourth connecting portions.

8. The power converter according to claim 7, further including a diode inversely connected in parallel to the switching device of each arm, wherein an output current flowing through the switching device and a flywheel current flowing through the diode flow parallel to each other on the base portion.

9. The power converter according to claim 7, wherein a width of the end portion of the electrode portion is smaller than a width of the base portion.

10. The power converter according to claim 7, wherein the base portion has a cutout arranged near the first, second, third or fourth connecting portions, the cutout extending laterally from the lateral end of the base portion.

11. The power converter, according to claim 7, wherein a width of the base portion is narrowed between the first and second connecting portions.

* * * * *